(12) United States Patent  
Sanwo et al.

(10) Patent No.: US 6,472,906 B2
(45) Date of Patent: Oct. 29, 2002

(54) OPEN DRAIN DRIVER HAVING ENHANCED IMMUNITY TO I/O GROUND NOISE

(75) Inventors: Ikuo Jimmy Sanwo, San Marcos; Mahyar Nejat, San Diego; Jean-Robert Clerge, Escondido, all of CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/749,704

(22) Filed: Dec. 27, 2000

(65) Prior Publication Data

US 2002/0113621 A1 Aug. 22, 2002

(Under 37 CFR 1.47)

(51) Int. Cl.[7] .......................................... H03K 19/0175
(52) U.S. Cl. ............................... 326/83; 326/27; 326/81
(58) Field of Search ............................. 326/26, 27, 83, 326/86, 87, 117, 119, 121, 80, 81

(56) References Cited

U.S. PATENT DOCUMENTS

| | | | | |
|---|---|---|---|---|
| 5,537,070 A | * | 7/1996 | Risinger | 327/170 |
| 5,594,370 A | * | 1/1997 | Nguyen et al. | 326/86 |
| 6,157,216 A | * | 12/2000 | Lattimore et al. | 326/83 |
| 6,222,403 B1 | * | 4/2001 | Mitsuda | 326/26 |

OTHER PUBLICATIONS

Neil H.E. Weste, et al.; *Principles of CMOS VLSI Design: A Systems Perspective*, Addision–Wesley Publishing Company, pp. 137–143 (1993).

Sung–Mo (Steve) Kang, et al.; *CMOS Digital Integrated Circuits: Analysis and Design* (Second Edition), WCB/McGraw–Hill, pp. 141–191 (1999).

* cited by examiner

Primary Examiner—Don Phu Le
(74) Attorney, Agent, or Firm—Fitch, Even, Tabin & Flannery

(57) ABSTRACT

An open drain I/O driver includes an input node, an output node, a first reference node, a first transistor, and noise immunity circuitry. The first transistor has its gate coupled to the input node and its conducting path coupled in series with the output node and the first reference node. The first transistor operates to uncouple the output node from the first reference node in response to an input voltage applied to the input node. The noise immunity circuitry keeps the output node uncoupled from the first reference node during undershoot noise in a first reference voltage that causes the first transistor to change from an off state to an on state. The noise immunity circuitry includes second and third transistors. The second transistor has its gate coupled to the input node and its conducting path coupled in series with the conducting path of the first transistor. The third transistor is configured to keep the second transistor in an off state during the undershoot noise.

44 Claims, 5 Drawing Sheets

OPEN DRAIN DRIVER HAVING ENHANCED IMMUNITY TO I/O GROUND NOISE

BACKGROUND OF THE INVENTION

1. Field of the Invention

The present invention relates generally to bus drivers used in digital electronics, and more specifically to CMOS open drain bus drivers.

2. Discussion of the Related Art

A bus driver is a circuit that amplifies a bus data or control signal sufficiently to ensure valid reception of that signal at the destination. Bus drivers, which are typically controlled with normal logic levels, increase the driving capability of other devices, such as microprocessors, which themselves may be capable of driving no more than a single load.

FIG. 1 illustrates a conventional complementary metal-oxide semiconductor (CMOS) bus driver 20. The driver 20 includes a NAND gate 30 and an open drain I/O driver 40. The NAND gate 30 includes p-channel transistors M1, M2, and n-channel transistors M3, M4, all connected substantially as shown. The DATA input is coupled to the gates of transistors M2, M3, and the ENABLE input is coupled to the gates of transistors M1, M4. The drains of transistors M1, M2 are coupled to the high reference voltage VDD_INT, and the source of transistor M4 is coupled to the low reference voltage VSS_INT (which is typically ground).

An open drain driver is a type of structure found in certain CMOS logic families. The output of an open drain driver is characterized by an active transistor pull-down for taking the output to a low voltage level and no pull-up device. The pull-down transistor is normally an n-channel metal-oxide-semiconductor field-effect transistor (MOSFET). Resistive pull-ups are generally added to provide the high-level output voltage. In the open drain driver 40, n-channel transistor M5 is the pull-down device and resistor R1 serves as the resistive pull-up. The drain of transistor M5 serves as the output $V_{OUT}$. Resistor R1 is coupled to the high reference voltage VDD_EXT, and the source of transistor M5 is coupled to the low reference voltage VSS_EXT (typically ground).

The bus driver 20 is an example of a bus driver having a final open drain stage. This type of driver is used in the well-known Inter Integrated Circuit bus (also known as the Inter-IC or I²C bus). In many bus drivers of this type it is common for all of the driver stages to use a common internal ground, except for the final open drain stage which uses its own external ground. In other words, the open drain transistor of the final open drain stage typically has its own external source of bias and ground. Thus, in the bus driver 20 the internal low reference voltage VSS_INT is isolated from the external low reference voltage VSS_EXT.

When the external reference voltage VSS_EXT is connected to simultaneously switching outputs (SSO) circuitry, undershoot noise can occur on the VSS_EXT line. SSO is a well-known potential source of system noise, and SSO noise is often the largest component in the noise budget. Specifically, SSO causes rapid current changes in the power and ground buses. Because of supply pin inductance, this current change causes bus voltage fluctuation, and thus reduces core and input noise margins. This noise can cause the driver circuit to generate false logic states, which is highly undesirable.

One common technique for attempting to remedy the SSO noise problem involves substantial modification to the integrated circuit package to reduce the power path inductance. Also, the number of ground pins can be increased to reduce the ground noise. In general, these modifications are undesirable due to constraints they can place on circuit density, layout and cost of implementation.

Thus, there is a need for an apparatus and/or method which overcomes these and other disadvantages. Namely, there is a need for a way to reduce the undesirable effects of undershoot ground line noise in bus drivers having a final open drain stage.

SUMMARY OF THE INVENTION

The present invention advantageously addresses the needs above as well as other needs by providing a driver that includes an input node, an output node, a first reference node, a first transistor, and noise immunity circuitry. The first transistor has a gate and a conducting path with the gate coupled to the input node and the conducting path coupled in series with the output node and the first reference node. The noise immunity circuitry is configured to keep the output node uncoupled from the first reference node during an occurrence of noise in a first reference voltage applied to the first reference node that causes the first transistor to change from an off state to an on state.

Another version of the present invention provides a driver that includes an input node, an output node, a first reference node, means for uncoupling the output node from the first reference node in response to an input voltage applied to the input node, and means for keeping the output node uncoupled from the first reference node during an occurrence of noise in a first reference voltage applied to the first reference node.

Another version of the present invention provides a method of performing a driver function. The method includes the steps of: receiving an input voltage at an input node; receiving a first reference voltage at a first reference node; uncoupling an output node from the first reference node in response to the input voltage; and keeping the output node uncoupled from the first reference node during an occurrence of noise in the first reference voltage.

Yet another version of the present invention provides a method of performing a driver function. The method includes the steps of: receiving an input voltage at an input node; receiving a first reference voltage at a first reference node; establishing a first transistor having a gate and a conducting path with the gate coupled to the input node and the conducting path coupled in series with an output node and the first reference node; turning the first transistor off in response to the input voltage; and keeping the output node uncoupled from the first reference node during an occurrence of noise in the first reference voltage that causes the first transistor to change from an off state to an on state.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

The above and other aspects featured and advantages of the present invention will be more apparent from the following more particular description thereof presented in conjunction with the following drawings herein.

Corresponding reference characters indicate corresponding components throughout several views of the drawing.

DETAILED DESCRIPTION OF A PREFERRED EMBODIMENT

The following description is not to be taken in a limiting sense, but is made for the purpose of describing the general principles of the invention. The scope of the invention should be determined with reference to the claims.

Figure 1:
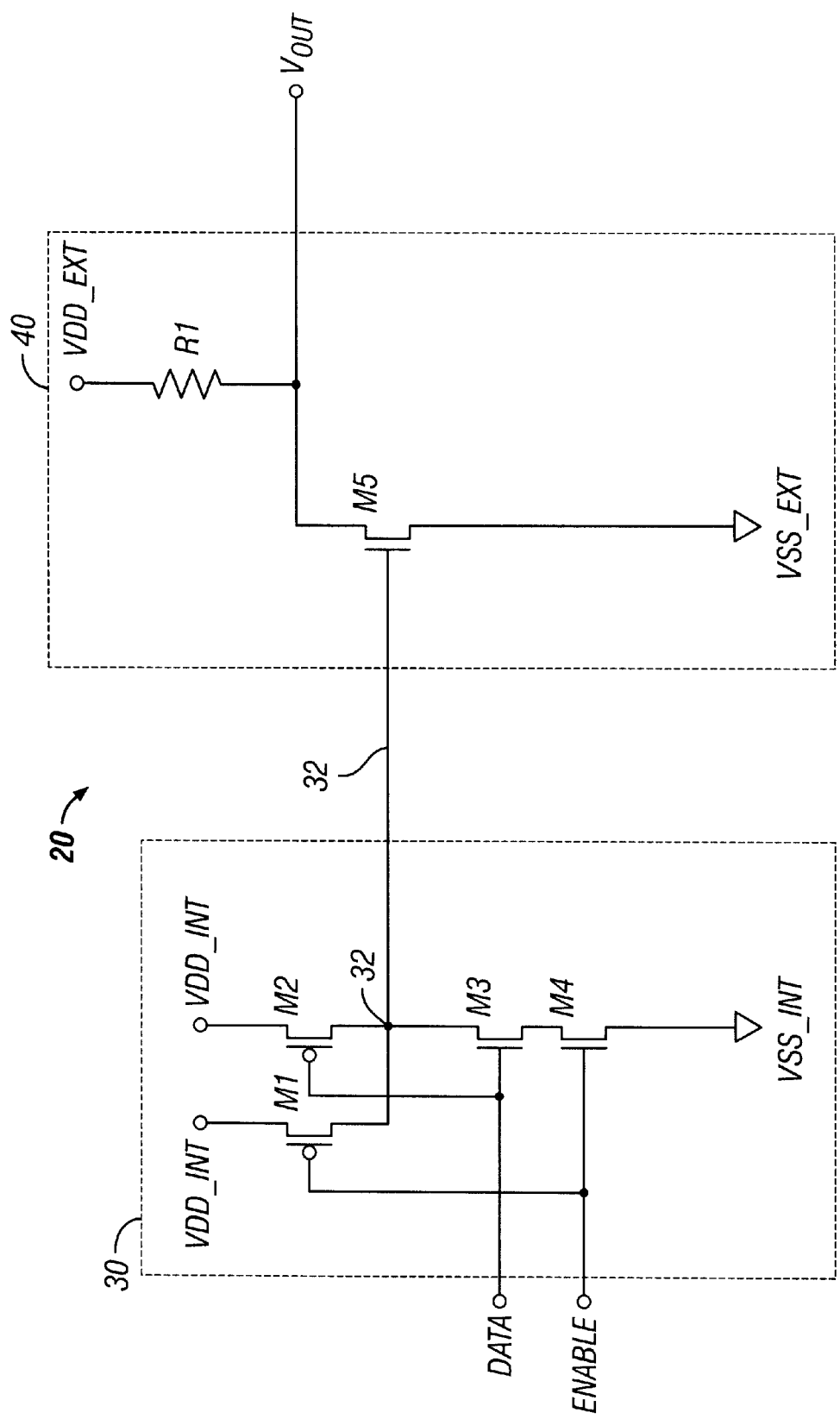
FIG. 1 is a schematic diagram illustrating a conventional bus driver having an open drain I/O driver.

This description begins with a detailed discussion of the operation of the bus driver 20 shown in FIG. 1. The bus driver 20 includes a CMOS NAND gate 30 followed by an open drain I/O driver 40. The inputs of the NAND gate 30 are labeled DATA and ENABLE. The output of the NAND gate 30 is generated at node 32, which also serves as the input of the open drain I/O driver 40. The output of the open drain I/O driver 40 is labeled $V_{OUT}$.

When DATA and ENABLE are both high, transistors M1 and M2 are both turned off, while transistors M3 and M4 are both turned on. These input conditions result in the output node 32 being pulled down to VSS_INT. When DATA and ENABLE are both low, transistors M3 and M4 are both turned off, while transistors M1 and M2 are both turned on. These input conditions result in the output node 32 being pulled up to VDD_INT. Similarly, for any other boolean conditions of DATA and ENABLE, either transistor M3 or M4 will be turned off, while either transistor M1 or M2 will be turned on, which results in the output node 32 being pulled up to VDD_INT. Thus, transistors M1, M2, M3 and M4 establish a typical NAND gate function where the output node 32 is always pulled high except when both inputs DATA and ENABLE are high.

The NAND gate 30's output node 32, which swings from VDD_INT to VSS_INT, is tied to the gate of transistor M5 and serves as the input of the open drain I/O driver 40 stage. The driver 40 comprises an inverter that uses a resistor load R1 as the pull-up device and the n-channel transistor M5 as the pull-down device. When the input node 32 is high, transistor M5 is turned on, which pulls the output $V_{OUT}$ virtually down to VSS_EXT. The output $V_{OUT}$ is pulled down because transistor M5 effectively couples the output $V_{OUT}$ to the VSS_EXT node. When the input node 32 is low, transistor M5 is turned off, and the output $V_{OUT}$ is pulled up to VDD_EXT by the load resistor R1. With this condition, the output $V_{OUT}$ is effectively uncoupled from the VSS_EXT node.

As mentioned above, one of the drawbacks of using an open drain I/O driver is its susceptibility to ground noise from simultaneous switching outputs (SSO). In order to illustrate the potential problems, assume that the DATA and ENABLE inputs are both high so that node 32 is pulled down to VSS_INT. This condition results in the gate of transistor M5 being pulled down to VSS_INT, which normally turns transistor M5 off and allows the output $V_{OUT}$ to be pulled up to VDD_EXT by the load resistor R1. If, however, the reference voltage VSS_EXT sustains a strong undershoot due to noise, transistor M5 could possibly turn on, which would pull the output $V_{OUT}$ low and is a highly undesirable result.

The reason transistor M5 could turn on is that, due to the isolation between VSS_INT and VSS_EXT, the undershoot in VSS_EXT does not affect VSS_INT. Transistor M5 will turn on if the level of VSS_EXT falls far enough below VSS_INT such that the gate-source voltage $V_{GS}$ of transistor M5 surpasses its threshold voltage $V_T$. It can be shown that the minimum amount of undershoot necessary to turn transistor M5 on is:

$$V_{IL} = V_{to} + \frac{1}{(k_n R_L)^1} \qquad (1)$$

where, $$k_n = \mu_n C_{ox}(W/L) \qquad (2)$$

$\mu_n$=mobility of carriers in channel (electrons in NMOS);
$C_{ox}$=dielectric constant of oxide under gate divided by thickness of the oxide;
W=channel width;
L=channel length; and
$R_L$=value of the load resistor R1.

Using these equations it can be shown that an amount of undershoot in VSS_EXT of greater than or equal to about 50% of the supply voltage can cause transistor M5 to turn on. Therefore, undershoot ground noise in VSS_EXT can undesirably turn transistor M5 on when it is supposed to be turned off.

Figure 2:
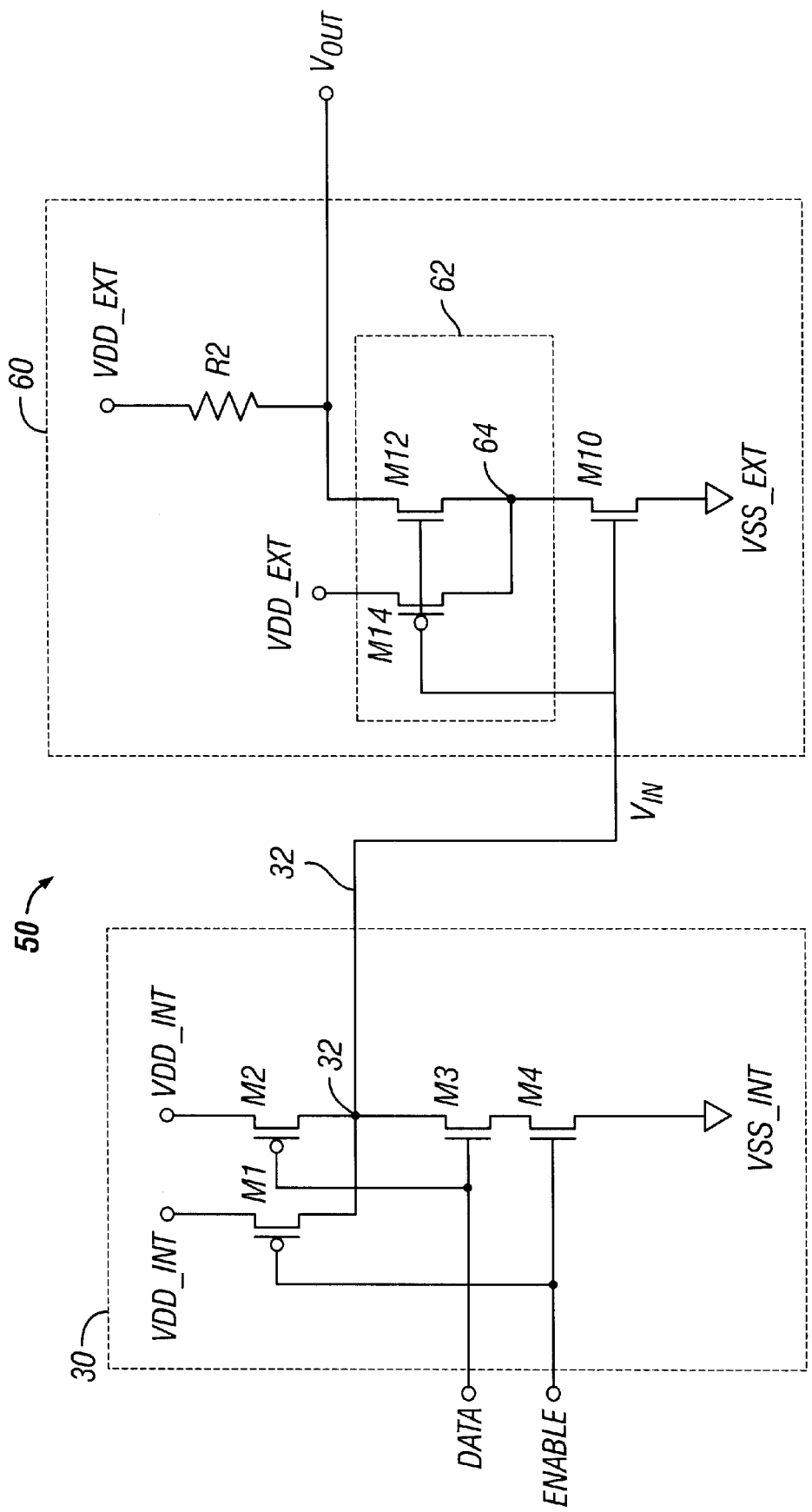
FIG. 2 is a schematic diagram illustrating an open drain I/O driver made in accordance with one embodiment of the present invention.

Referring to FIG. 2, there is illustrated a bus driver 50 made in accordance with an embodiment of the present invention. The driver 50 overcomes the disadvantages of conventional bus drivers in that it has improved performance against ground noise. Specifically, the driver 50 includes an open drain driver 60 made in accordance with an embodiment of the present invention. The open drain driver 60 preferably performs an inverter function. Advantageously, the open drain driver 60 includes means which greatly reduce, and can even prevent, the generation of false logic states during undershoot ground noise. This provides for a ground-noise-immune open drain inverter/driver.

In the illustrated version of the inventive driver 50, the open drain driver 60 is driven by the CMOS NAND gate 30 described above. Again, the NAND gate 30's output node 32, which swings from VDD_INT to VSS_INT, is always pulled high except when both the DATA and ENABLE inputs are high. While the operation of the driver 60 will be described here in the context of being driven by the NAND gate 30, it should be well understood that use of the NAND gate 30 is not a requirement of the present invention. As will be discussed below, the driver 60 may be driven by any type of logic or digital circuit.

In the illustrated version, the driver 60 includes an n-channel transistor M10 and noise immunity circuitry 62. The source of transistor M10 is coupled to VSS_EXT, and the gate of transistor M10 is coupled to the output node 32 of the NAND gate 30. The drain-source conducting path of transistor M10 is coupled in series with the output node $V_{OUT}$ and the VSS_EXT reference node. Thus, when node 32 is pulled low by the NAND gate 30 to turn transistor M10 off, the output node $V_{OUT}$ is uncoupled from the VSS_EXT reference node.

The noise immunity circuitry 62 is preferably configured to keep the output node $V_{OUT}$ uncoupled from the VSS_EXT reference node during an occurrence of noise in VSS_EXT that causes transistor M10 to change from an off state to an on state. The noise immunity circuitry 62 preferably includes n-channel transistor M12 and p-channel transistor M14. The gates of both transistors M12 and M14 are coupled to node 32. The drain-source conducting path of transistor M12 is coupled in series with the drain-source conducting path of transistor M10. The source-drain conducting path of transistor M14 is coupled between the VDD_EXT reference node and the source of transistor M12. Finally, a load resistor R2 is coupled between VDD_EXT and the output node $V_{OUT}$.

The driver 60 preferably comprises a CMOS short channel open drain driver. Namely, transistors M10, M12 and M14 preferably have short conducting channels. By way of example, transistor M10 may have a channel length of 0.5 μm and a channel width of 300 μm, transistor M12 may have a channel length of 0.5 μm and a channel width of 300 μm, and transistor M14 may have a channel length of 0.5 μm and a channel width of 300 μm. Furthermore, resistor R2 may have a value of 5 KΩ. It should be well understood, however, that these are merely exemplary values and are not requirements of the present invention.

During operation, when node 32 is high, transistor M14 is turned off and transistors M10 and M12 are both turned on and are pulling the output $V_{OUT}$ down to VSS_EXT. When node 32 is low, transistors M10 and M12 are both turned off and transistor M14 is turned on. Transistor M14 pulls node 64 up to VDD_EXT, and $V_{OUT}$ is also pulled up to VDD_EXT by load resistor R2.

The provision of ground noise immunity by the driver 60 can be explained as follows. When node 32 is pulled down to VSS_INT by NAND gate 30, transistors M10 and M12 are both turned off while transistor M14 is fully turned on. If VSS_EXT sustains a strong undershoot, transistor M10 may turn on due to VSS_EXT falling far enough below the isolated VSS_INT. Transistor M14, however, stays turned on and keeps node 64 pulled up to VDD_EXT. Thus, transistor M12 remains turned off, which means that the $V_{OUT}$ node remains uncoupled from VSS_EXT and remains pulled up to $VDD_{EXT}$. Transistor M12 remains turned off because with its source pulled up to VDD_EXT and its gate pulled down to VSS_INT, its gate-source voltage $V_{GS}$ is nowhere near surpassing the threshold voltage $V_T$. By pulling the source of transistor M12 up to VDD_EXT, transistor M14 keeps transistor M12 in an off state during the occurrence of noise.

The minimum amount of undershoot necessary to turn transistor M12 on can be calculated using the formula below:

$$V_{IL} = \frac{\{k_{N1}R_L(V_{TP} - 2V_{TN1} - V_{DD} + k_R V_{TN2}) - 2\}}{\{k_{N1}R_L(k_R - 1)\}^{23}} \quad (3)$$

where, $$k_R = \frac{k_{N1}}{k_P} \quad (4)$$

$k_{N1}$=k for n-channel transistor M12;
$k_P$=k for p-channel transistor M14;
$V_{TN1}$=threshold voltage of n-channel transistor M12;
$V_{TN2}$=threshold voltage of n-channel transistor M10; and
$V_{TP}$=threshold voltage of p-channel transistor M14.

These equations show that a very large undershoot is required to turn on transistor M12. Thus, the open drain driver 60 is resistant to virtually all undershoot ground noise, which provides for enhanced immunity to I/O ground noise.

Figure 3:
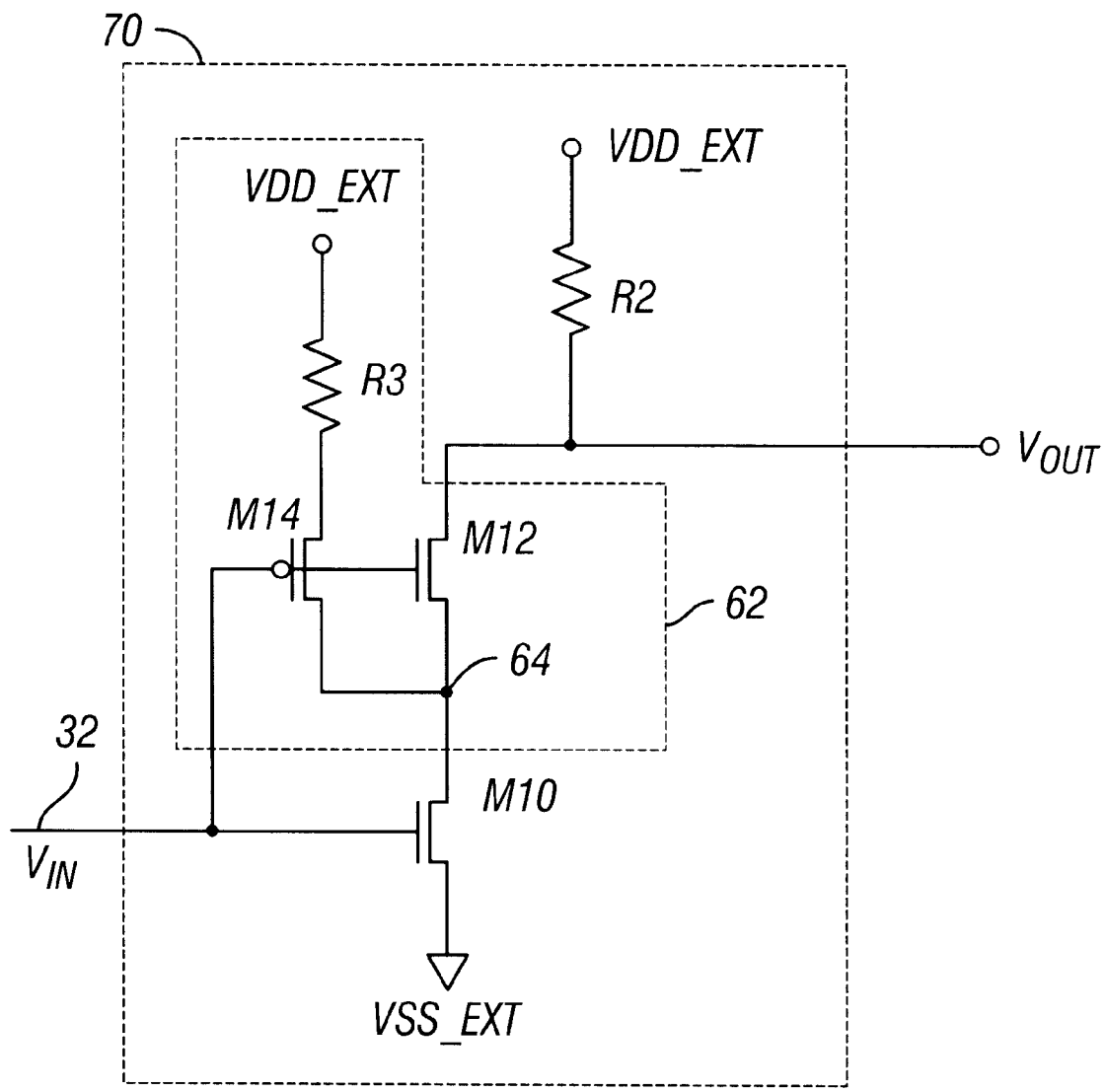
FIG. 3 is a schematic diagram illustrating an open drain I/O driver made in accordance with another embodiment of the present invention.

Referring to FIG. 3, there is illustrated another version of an open drain driver made in accordance with the present invention. The driver 70 is substantially the same as the driver 60 except that a resistor R3 has been added. Resistor R3 is coupled between VDD_EXT and the source of transistor M14. Use of resistor R3, which is optional, will prevent the source of transistor M12 from being pulled all the way up to VDD_EXT. This will help transistor M12 turn on quicker when node 32 is eventually pulled high, which speeds up the operation and reduces the noise margin. By way of example, resistor R3 may have a value of 0.1 KΩ.

Figure 4A:
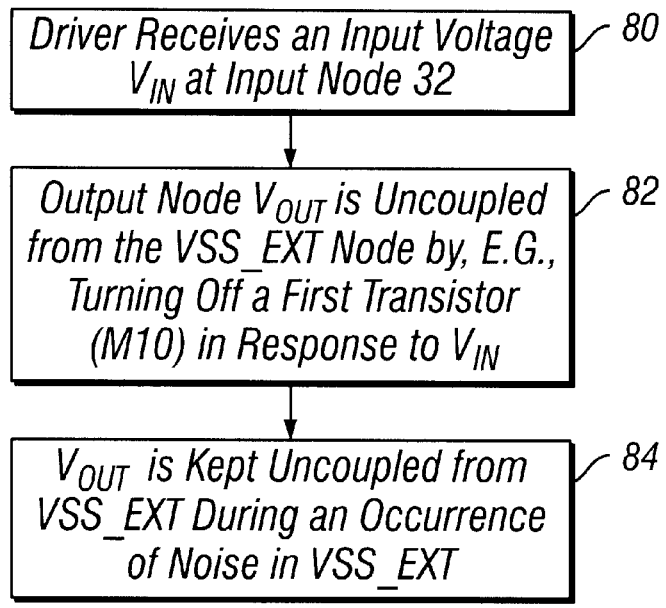
FIGS. 4A and 4B are flow diagrams illustrating a method of operating a driver in accordance with an embodiment of the present invention.

Referring to FIG. 4A, there is illustrated a method of operating a driver, such as the driver 60, in accordance with the present invention. Specifically, in step 80 an input voltage $V_{IN}$ is received at node 32. In step 82 the output node $V_{OUT}$ is uncoupled from the VSS_EXT node. This step may be performed, for example, by turning off a first transistor (e.g., M10) in response to $V_{IN}$. In step 84 the output node $V_{OUT}$ is kept uncoupled from the VSS_EXT node during the occurrence of noise, such as undershoot noise, in the VSS_EXT reference voltage.

Figure 4B:
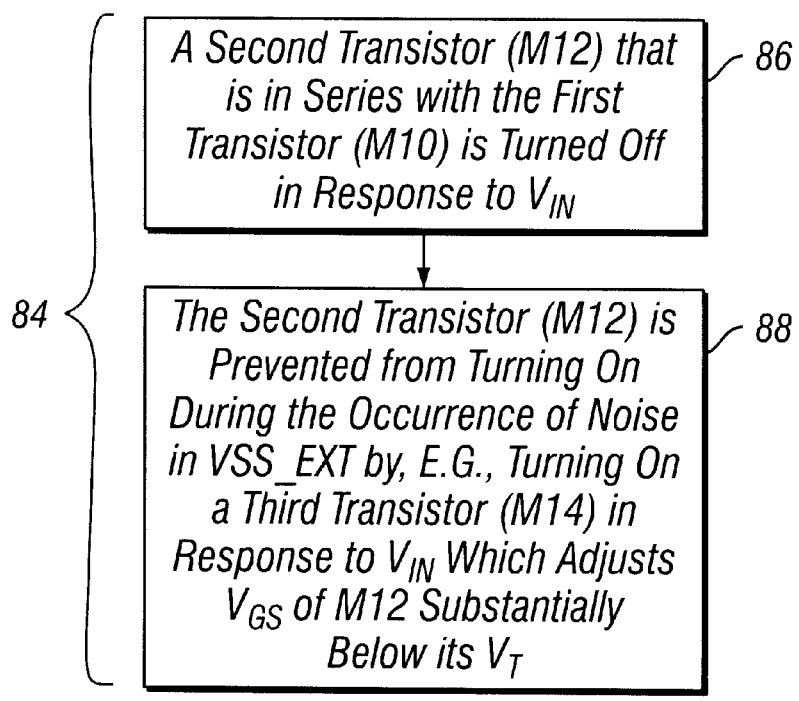

An exemplary way of performing step 84 is illustrated in FIG. 4B. Specifically, in step 86 a second transistor (e.g., M12) that is in series with the first transistor may be turned off in response to $V_{IN}$. This uncouples the output node $V_{OUT}$ from the VSS_EXT node. Then, the second transistor is prevented from turning on during the occurrence of noise in VSS_EXT in step 88. This keeps the output node $V_{OUT}$ uncoupled from the VSS_EXT node. By way of example, the second transistor may be prevented from turning on by turning on a third transistor (e.g., M14) in response to $V_{IN}$. The third transistor pulls the source of the second transistor high so that its gate-source voltage $V_{GS}$ is well below the threshold voltage $V_T$, which substantially reduces the chances of the second transistor turning on. By way of example, the first and second transistors may comprise n-channel MOSFETs, and the third transistor may comprise a p-channel MOSFET.

Figure 5A:
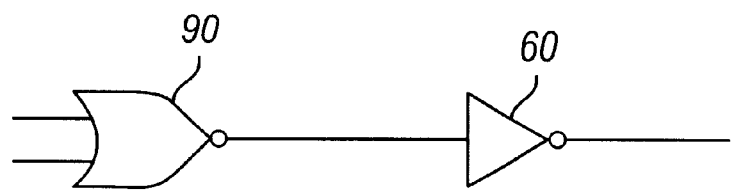
FIGS. 5A, 5B and 5C are schematic diagrams illustrating various different devices driving the open drain I/O driver shown in FIG. 2.
Figure 5B:
Figure 5C:
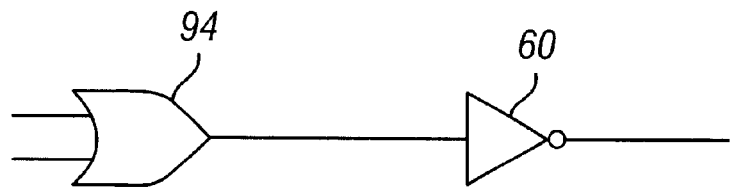

It was mentioned above that the driver 60 may be driven by any type of logic or digital circuit. By way of example, the driver 60 may be driven by a NOR gate 90 as shown in FIG. 5A, by an AND gate 92 as shown in FIG. 5B, or by an OR gate 94 as shown in FIG. 5C. Again, these are merely examples and are not intended to be limitations of the present invention.

Figure 6:
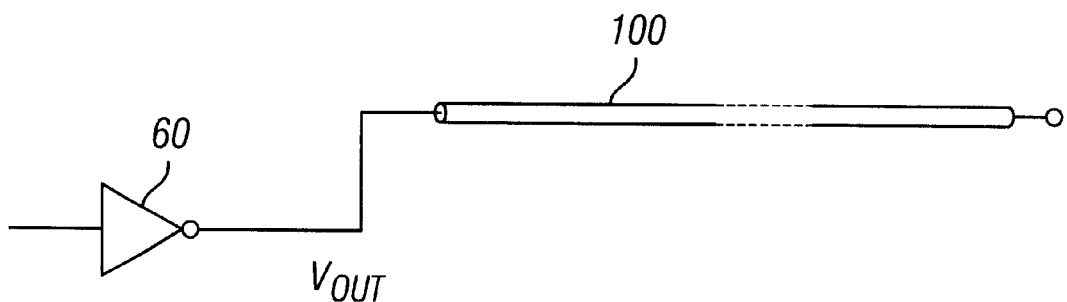
FIG. 6 is a schematic diagram illustrating the open drain I/O driver shown in FIG. 2 driving a bus.

Finally, FIG. 6 illustrates the driver 60 being used to drive a bus or transmission line 100. By way of example, the driver 60 is ideal for use in I²C bus applications, digital television (DTV) applications, and numerous other applications.

While the invention herein disclosed has been described by the specific embodiments and applications thereof, numerous modifications and variations could be made thereto by those skilled in the art without departing from the scope of the invention set forth in the claims.

What is claimed is:

1. A driver, comprising:
    an input node;
    an output node;
    a first reference node;

a first transistor having a gate and a conducting path with the gate coupled to the input node and the conducting path coupled in series with the output node and the first reference node; and noise immunity circuitry configured to keep the output node uncoupled from the first reference node during an occurrence of noise in a first reference voltage applied to the first reference node that causes the first transistor to change from an off state to an on state.

2. A driver in accordance with claim 1, wherein the noise immunity circuitry comprises:

a second transistor having a gate and a conducting path with the gate coupled to the input node and the conducting path coupled in series with the conducting path of the first transistor; and a third transistor configured to keep the second transistor in an off state during the occurrence of noise.

3. A driver in accordance with claim 2, further comprising:

a second reference node;

wherein the third transistor includes a gate and a conducting path with the gate coupled to the input node and the conducting path coupled between the second reference node and a source of the second transistor.

4. A driver in accordance with claim 3, further comprising:

a resistor coupled in series with the conducting path of the third transistor between the second reference node and the third transistor.

5. A driver in accordance with claim 2, wherein the second transistor comprises an n-channel transistor and the third transistor comprises a p-channel transistor.

6. A driver in accordance with claim 1, wherein the first transistor comprises an n-channel transistor.

7. A driver in accordance with claim 1, wherein the occurrence of noise comprises:

an undershoot in the first reference voltage.

8. A driver in accordance with claim 7, wherein the undershoot causes the first reference voltage to fall below an input voltage applied to the input node.

9. A driver in accordance with claim 1, further comprising:

a second reference node; and a resistor coupled between the output node and the second reference node.

10. A driver in accordance with claim 1, further comprising:

a logic gate having an output coupled to the input node, the logic gate including a low reference node that is isolated from the first reference node.

11. A driver in accordance with claim 10, wherein the logic gate comprises a NAND gate.

12. A driver, comprising;

an input node;

an output node;

a first reference node;

means for uncoupling the output node from the first reference node in response to an input voltage applied to the input node; and means for keeping the output node uncoupled from the first reference node during an occurrence of noise in a first reference voltage applied to the first reference node that causes an open conducting path created by the means for uncoupling to close.

13. A driver in accordance with claim 12, wherein the occurrence of noise comprises:

an undershoot in the first reference voltage.

14. A driver in accordance with claim 13, wherein the undershoot causes the first reference voltage to fall below the input voltage.

15. A driver in accordance with claim 12, wherein the means for uncoupling comprises:

a first transistor having a gate coupled to the input node and a conducting path coupled in series with the output node and the first reference node.

16. A driver in accordance with claim 12, wherein the means for keeping comprises:

a first transistor having a gate coupled to the input node and a conducting path coupled in series with the output node and the first reference node; and means for preventing the first transistor from turning on during the occurrence of noise in the first reference voltage.

17. A driver in accordance with claim 12, further comprising:

a logic gate having an output coupled to the input node, the logic gate including a low reference node that is isolated from the first reference node.

18. A driver in accordance with claim 17, wherein the logic gate comprises a NAND gate.

19. A driver in accordance with claim 12, further comprising:

a second reference node; and a resistor coupled between the output node and the second reference node.

20. A driver in accordance with claim 15, wherein the first transistor comprises an n-channel transistor.

21. A driver in accordance with claim 16, wherein the first transistor comprises an n-channel transistor.

22. A driver comprising:

an input node;

an output node;

a first reference node;

means for uncoupling the output node from the first reference node in response to an input voltage applied to the input node;

means for keeping the output node uncoupled from the first reference node during an occurrence of noise in a first reference voltage applied to the first reference node;

a first transistor having a gate coupled to the input node and a conducting path coupled in series with the output node and the first reference node;

means for preventing the first transistor from turning on during the occurrence of noise in the first reference voltage; and a second reference node;

wherein the means for preventing comprises a second transistor having a gate coupled to the input node and a conducting path coupled in series with the second reference node and a source of the first transistor.

23. A driver in accordance with claim 22, further comprising:

a resistor coupled in series with the conducting path of the second transistor between the second reference node and the second transistor.

24. A driver in accordance with claim 22, wherein the second transistor comprises a p-channel transistor.

25. A method of performing a driver function, comprising the steps of:
   receiving an input voltage at an input node;
   receiving a first reference voltage at a first reference node;
   uncoupling an output node from the first reference node in response to the input voltage; and
   keeping the output node uncoupled from the first reference node during an occurrence of noise in the first reference voltage that causes an open conducting path created by the step of uncoupling to close.

26. A method in accordance with claim 25, wherein the occurrence of noise comprises an undershoot in the first reference voltage.

27. A method in accordance with claim 26, wherein the undershoot causes the first reference voltage to fall below the input voltage.

28. A method in accordance with claim 25, wherein the step of uncoupling comprises the steps of:
   establishing a first transistor having a gate coupled to the input node and a conducting path coupled in series with the output node and the first reference node; and
   turning the first transistor off in response to the input voltage.

29. A method in accordance with claim 25, wherein the step of keeping comprises the steps of:
   establishing a first transistor having a gate coupled to the input node and a conducting path coupled in series with the output node and the first reference node; and
   preventing the first transistor from turning on during the occurrence of noise in the first reference voltage.

30. A method in accordance with claim 25, further comprising the step of:
   generating the input voltage with a logic gate having a low reference node that is isolated from the first reference node.

31. A method in accordance with claim 30, wherein the logic gate comprises a NAND gate.

32. A method of performing a driver function, comprising the steps of:
   receiving an input voltage at an input node;
   receiving a first reference voltage at a first reference node;
   uncoupling an output node from the first reference node in response to the input voltage;
   keeping the output node uncoupled from the first reference node during an occurrence of noise in the first reference voltage;
   establishing a first transistor having a gate coupled to the input node and a conducting path coupled in series with the output node and the first reference node;
   preventing the first transistor from turning on during the occurrence of noise in the first reference voltage;
   establishing a second transistor having a gate coupled to the input node and a conducting path coupled between a second reference node and a source of the first transistor; and
   turning the second transistor on in response to the input voltage.

33. A method of performing a driver function, comprising the steps of:
   receiving an input voltage at an input node;
   receiving a first reference voltage at a first reference node;
   establishing a first transistor having a gate and a conducting path with the gate coupled to the input node and the conducting path coupled in series with an output node and the first reference node;
   turning the first transistor off in response to the input voltage; and
   keeping the output node uncoupled from the first reference node during an occurrence of noise in the first reference voltage that causes the first transistor to change from an off state to an on state.

34. A method in accordance with claim 33, wherein the step of keeping comprises the steps of:
   establishing a second transistor having a gate and a conducting path with the gate coupled to the input node and the conducting path coupled in series with the conducting path of the first transistor; and
   maintaining the second transistor in an off state during the occurrence of noise.

35. A method in accordance with claim 34, wherein the step of maintaining comprises the steps of:
   establishing a third transistor having a gate and a conducting path with the gate coupled to the input node and the conducting path coupled between a second reference node and a source of the second transistor; and
   turning the third transistor on in response to the input voltage.

36. A method in accordance with claim 35, further comprising the step of:
   establishing a resistor coupled in series with the conducting path of the third transistor between the second reference node and the third transistor.

37. A method in accordance with claim 33, further comprising the step of:
   generating the input voltage with a logic gate having a low reference node that is isolated from the first reference node.

38. A method in accordance with claim 37, wherein the logic gate comprises a NAND gate.

39. A method in accordance with claim 33, wherein the occurrence of noise comprises an undershoot in the first reference voltage.

40. A method in accordance with claim 39, wherein the undershoot causes the first reference voltage to fall below the input voltage.

41. A method in accordance with claim 33, further comprising the step of:
   establishing a resistor coupled between the output node and a second reference node.

42. A method in accordance with claim 33, wherein the first transistor comprises an n-channel transistor.

43. A method in accordance with claim 34, wherein the second transistor comprises an n-channel transistor.

44. A method in accordance with claim 35, wherein the third transistor comprises a p-channel transistor.

* * * * *